United States Patent
Nakakohara et al.

(10) Patent No.: US 11,394,288 B2
(45) Date of Patent: Jul. 19, 2022

(54) NEGATIVE VOLTAGE GENERATION CIRCUIT AND POWER CONVERSION DEVICE USING SAME

(71) Applicant: Rohm Co., Ltd., Kyoto (JP)

(72) Inventors: Yusuke Nakakohara, Kyoto (JP); Yuta Okawauchi, Kyoto (JP); Ken Nakahara, Kyoto (JP); Shinichiro Nagai, Gunma (JP); Yuuki Ootabara, Gunma (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/962,015

(22) PCT Filed: Dec. 11, 2018

(86) PCT No.: PCT/JP2018/045460
§ 371 (c)(1),
(2) Date: Jul. 14, 2020

(87) PCT Pub. No.: WO2019/146290
PCT Pub. Date: Aug. 1, 2019

(65) Prior Publication Data
US 2020/0350814 A1    Nov. 5, 2020

(30) Foreign Application Priority Data
Jan. 29, 2018  (JP) .............................. JP2018-012896

(51) Int. Cl.
*H02M 1/08* (2006.01)
*H02M 3/07* (2006.01)
(Continued)

(52) U.S. Cl.
CPC .............. *H02M 1/08* (2013.01); *H02M 3/07* (2013.01); *H02M 7/537* (2013.01); *H03K 17/687* (2013.01)

(58) Field of Classification Search
CPC .......... H02M 1/08; H02M 3/07; H02M 3/158; H02M 7/537; H03K 17/687;
(Continued)

(56) References Cited

U.S. PATENT DOCUMENTS 6,147,887 A     11/2000  Miettinen
2001/0005028 A1  6/2001  Shimoida et al.
(Continued)

FOREIGN PATENT DOCUMENTS

DE        69913642      10/2004
DE       102007009885   10/2007
(Continued)

OTHER PUBLICATIONS

Japan Patent Office, International Search Report for PCT/JP2018/045460 dated Feb. 26, 2019.

*Primary Examiner* — Sibin Chen
(74) *Attorney, Agent, or Firm* — Fish & Richardson P.C.

(57) ABSTRACT

A negative voltage generation circuit 200 includes a first DC voltage source 201 having a positive terminal connected to a first node N1 (Vin), a first diode 202 having a cathode connected to a negative terminal of the first DC voltage source 201 and an anode connected to an output terminal of a first negative voltage VC1 (fourth node N4), and a first capacitor 204 having a first terminal connected to an output terminal of the first negative voltage VC1 and a second terminal connected to a second node N2 (Vs_high), so as to supply the first negative voltage VC1 to a first driver 20 that performs switching control of a first NMOSFET 11 (first switch element) connected between the first node N1 (Vin) and the second node N2 (Vs_high).

5 Claims, 14 Drawing Sheets

(51) Int. Cl.
*H02M 7/537* (2006.01)
*H03K 17/687* (2006.01)

(58) Field of Classification Search
CPC ......... H03K 17/063; H03K 2217/0063; H03K 2217/0072; H03K 2217/0081
See application file for complete search history.

(56) References Cited

U.S. PATENT DOCUMENTS

| | | |
|---|---|---|
| 2007/0216469 A1 | 9/2007 | Sakamoto |
| 2011/0074489 A1* | 3/2011 | Viitanen ................. H02M 1/08 327/427 |
| 2012/0119721 A1 | 5/2012 | Bayerer et al. |
| 2016/0301401 A1 | 10/2016 | Won et al. |
| 2017/0111040 A1* | 4/2017 | Iwaya .................. H03K 17/063 |

FOREIGN PATENT DOCUMENTS

| | | |
|---|---|---|
| JP | 2001-189653 A | 7/2001 |
| JP | 2008029163 | 2/2008 |
| JP | 2010035389 | 2/2010 |
| JP | 2010-154721 A | 7/2010 |
| JP | 2011-066963 A | 3/2011 |
| JP | 2014-068326 A | 4/2014 |

\* cited by examiner

NEGATIVE VOLTAGE GENERATION CIRCUIT AND POWER CONVERSION DEVICE USING SAME

TECHNICAL FIELD

The invention disclosed in this specification relates to a negative voltage generation circuit and a power conversion device using the same.

BACKGROUND ART

Conventionally, in order to improve turn-off speed of a switch element, there is known a method of applying a negative voltage when turning off the switch element.

Note that there is Patent Document 1 as an example of a conventional technique related to the above description.

LIST OF CITATIONS

Patent Literature

Patent Document 1: JP-A-2011-66963 (e.g. FIG. 1)

SUMMARY OF THE INVENTION

Technical Problem

However, the Patent Document 1 describes that a power supply (a first power supply 111b of FIG. 1) whose positive electrode is connected to a switch element is used for generating a negative voltage, and its circuit structure has a room for further improvement.

In view of the above problem found by the inventors of this application, it is an object of the invention disclosed in this specification to provide a negative voltage generation circuit of a small circuit scale.

Means for Solving the Problem

A negative voltage generation circuit disclosed in this specification includes a first DC voltage source having a positive terminal connected to a first node, a first diode having a cathode connected to a negative terminal of the first DC voltage source and an anode connected to an output terminal of a first negative voltage, and a first capacitor having a first terminal connected to the output terminal of the first negative voltage and a second terminal connected to a second node, in which the first negative voltage is supplied to a first driver arranged to perform switching control of a first switch element connected between the first node and the second node.

Note that other features, elements, steps, advantages, and characteristics of the present invention will become more apparent from the description of the best mode embodiment given below and the related attached drawings.

Advantageous Effects of the Invention

According to the invention disclosed in this specification, a negative voltage generation circuit of a small circuit scale can be provided.

DESCRIPTION OF EMBODIMENTS

First Embodiment

Figure 1:
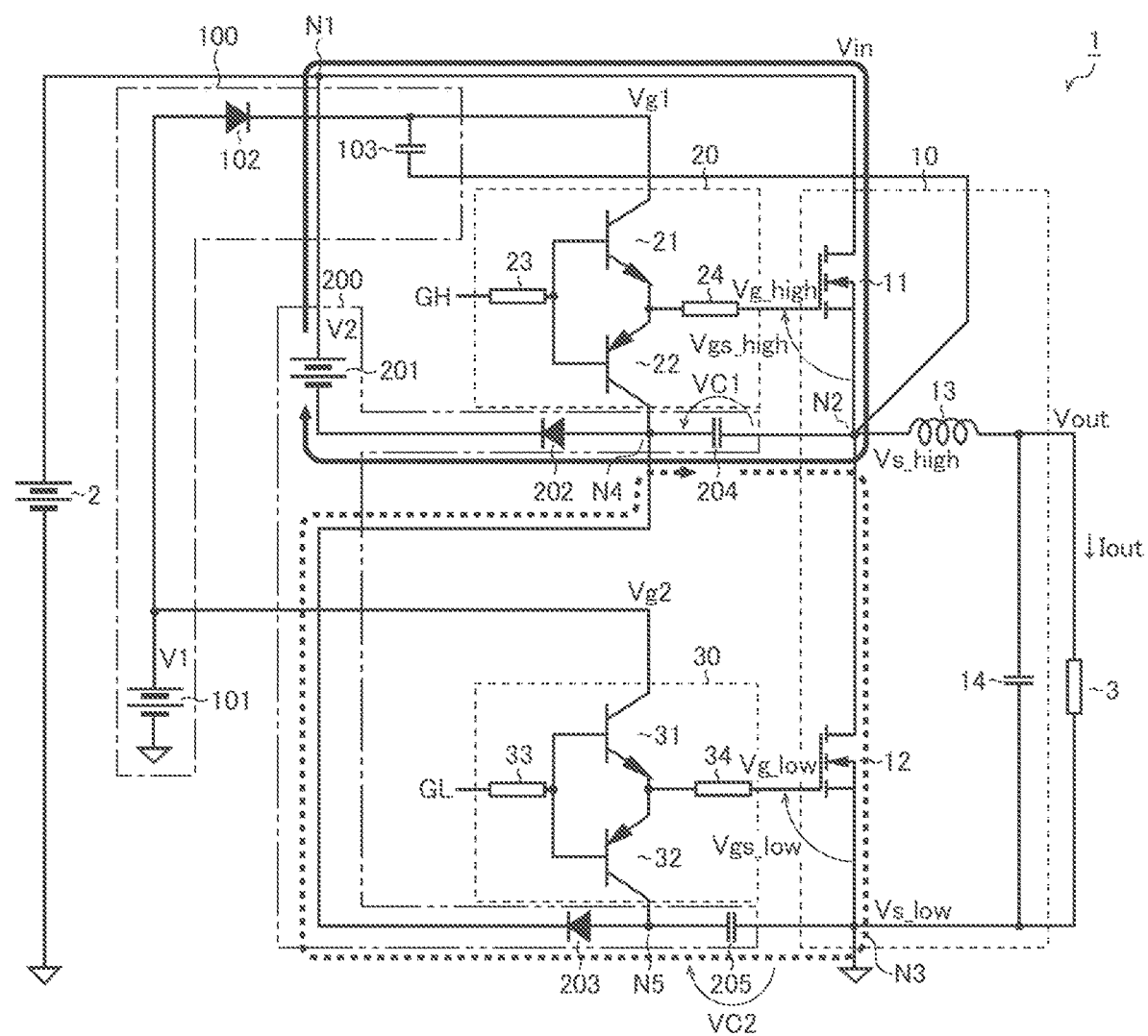
FIG. 1 is a diagram illustrating a first embodiment of a switching power supply device.

FIG. 1 is a diagram illustrating a first embodiment of a switching power supply device. A switching power supply device 1 of this embodiment is a power conversion device that steps down an input voltage Vin input from a DC voltage source 2 so as to generate a desired output voltage Vout (and output current Iout), and supplies the same to a load 3. The switching power supply device 1 includes a switch output stage 10, a high-side driver 20, a low-side driver 30, a positive voltage generation circuit 100, and a negative voltage generation circuit 200.

The switch output stage 10 includes an N-channel type metal oxide semiconductor field effect transistors (NMOS-FETs) 11 and 12 (corresponding to a high-side switch and a low-side switch, respectively), an inductor 13, and a capacitor 14.

A drain of the NMOSFET 11 is connected to a node N1 of the switch output stage 10 (i.e. an input node to which the input voltage Vin is applied). A source and a backgate of the NMOSFET 11 and a drain of the NMOSFET 12 are connected to a node N2 of the switch output stage 10 (i.e. a switch node to which a high-side source voltage Vs_high of a rectangular wave is applied). A source and a backgate of the NMOSFET 12 are connected to a node N3 of the switch output stage 10 (i.e. a ground node to which a low-side source voltage Vs_low of a ground level is applied).

A first terminal of the inductor 13 is connected to the node N2. A second terminal of the inductor 13 and a first terminal of the capacitor 14 are connected to a first terminal of the load 3 as an output terminal of the output voltage Vout. A second terminal of the capacitor 14 and a second terminal of the load 3 are connected to the node N3.

The high-side driver 20 is a circuit block that generates a high-side gate voltage Vg_high in accordance with a high-side control signal GH input from a not-shown switch controller and outputs the same to a gate of the NMOSFET 11, and includes an npn type bipolar transistor 21, a pnp type bipolar transistor 22, and resistors 23 and 24. Instead of the bipolar transistors, MOSFETs may be used as the transistors 21 and 22, for example.

A collector of the transistor 21 is connected to an application terminal of a positive voltage Vg1. Bases of the transistors 21 and 22 are connected to each other, and the connection node thereof is connected to an application terminal of the high-side control signal GH via the resistor 23. Emitters of the transistors 21 and 22 are connected to each other, and the connection node thereof is connected to the gate of the NMOSFET 11 via the resistor 24. A collector of the transistor 22 is connected to an application terminal of a negative voltage VC1.

Note that when the high-side control signal GH is high level, the transistor 21 is ON while the transistor 22 is OFF. Therefore the high-side gate voltage Vg_high is high level (i.e. Vg1), and hence the NMOSFET 11 is ON. On the contrary, when the high-side control signal GH is low level, the transistor 21 is OFF while the transistor 22 is ON. Therefore the high-side gate voltage Vg_high is low level (i.e. VC1), and hence the NMOSFET 11 is OFF.

The low-side driver 30 is a circuit block that generates a low-side gate voltage Vg_low in accordance with a low-side control signal GL input from the not-shown switch controller, and outputs the same to a gate of the NMOSFET 12, and includes an npn type bipolar transistor 31, an pnp type bipolar transistor 32, and resistors 33 and 34. Instead of the bipolar transistors, MOSFETs may be used as the transistors 31 and 32, for example.

A collector of the transistor 31 is connected to an application terminal of a positive voltage Vg2. Bases of the transistors 31 and 32 are connected to each other, and the connection node thereof is connected to an application terminal of the low-side control signal GL via the resistor 33. Emitters of the transistors 31 and 32 are connected to each other, and the connection node thereof is connected to the gate of the NMOSFET 12 via the resistor 34. A collector of the transistor 32 is connected to an application terminal of a negative voltage VC2.

Note that when the low-side control signal GL is high level, the transistor 31 is ON while the transistor 32 is OFF. Therefore the low-side gate voltage Vg_low is high level (i.e. Vg2), and hence the NMOSFET 12 is ON. On the contrary, when the low-side control signal GL is low level, the transistor 31 is OFF while the transistor 32 is ON. Therefore the low-side gate voltage Vg_low is low level (i.e. VC2), and hence the NMOSFET 12 is OFF.

The positive voltage generation circuit 100 is a circuit block that supplies the positive voltages Vg1 and Vg2 to the high-side driver 20 and the low-side driver 30, respectively, and includes a DC voltage source 101, a diode 102, and a capacitor 103.

A positive terminal of the DC voltage source 101 (i.e. an output terminal of a DC voltage V1) is connected to a collector of the transistor 31 and an anode of the diode 102. A negative terminal of the DC voltage source 101 is connected to the ground. A cathode of the diode 102 and a first terminal of the capacitor 103 are connected to an output terminal of the positive voltage Vg1 (i.e. the collector of the transistor 21). A second terminal of the capacitor 103 is connected to the node N2 (i.e. the application terminal of the high-side source voltage Vs_high).

The positive voltage generation circuit 100 configured as described above functions as a positive side bootstrap circuit, and generates the positive voltage Vg1 that is always higher than the high-side source voltage Vs_high by a voltage across terminals of the capacitor 103 (Vg1=Vs_high+V1-Vf102, where Vf102 represents a forward voltage drop of the diode 102).

The negative voltage generation circuit 200 is a circuit block that supplies the negative voltages VC1 and VC2 to the high-side driver 20 and the low-side driver 30, respectively, and includes a DC voltage source 201, diodes 202 and 203, and capacitors 204 and 205. Note that the negative voltage VC1 is a negative voltage with respect to Vs_high (i.e. a voltage that has a negative potential with respect to the high-side source voltage Vs_high as a reference potential). In contrast, the negative voltage VC2 is a negative voltage with respect to Vs_low (i.e. a voltage that has a negative potential with respect to the low-side source voltage Vs_low (i.e. GND) as a reference potential).

A positive terminal of the DC voltage source 201 is connected to the node N1. A negative terminal of the DC voltage source 202 (i.e. an output terminal of the DC voltage (Vin-V2)) is connected to a cathode of the diode 202. An anode of the diode 202 and a first terminal of the capacitor 204 are connected to a node N4 (i.e. an output terminal of the negative voltage VC1). A second terminal of the capacitor 204 is connected to the node N2 (i.e. the application terminal of the high-side source voltage Vs_high).

Further, a cathode of the diode 203 is connected to the node N4. An anode of the diode 203 and a first terminal of the capacitor 205 are connected to a node N5 (i.e. an output terminal of the negative voltage VC2). A second terminal of the capacitor 205 is connected to the node N3 (i.e. an application terminal of the low-side source voltage Vs_low).

Note that a thick solid line arrow in this diagram indicates a current path during an ON period of the NMOSFET 11. In this way, during the ON period of the NMOSFET 11, current flows in a closed circuit including the DC voltage source 201, the NMOSFET 11, the capacitor 204, and the diode 202.

In contrast, a thick broken line arrow in this diagram indicates a current path during an ON period of the NMOSFET 12. In this way, during the ON period of the NMOSFET 12, the capacitor 204 becomes a DC voltage source, and current flows in a closed circuit including the capacitor 204, the NMOSFET 12, the capacitor 205, and the diode 203.

The negative voltage generation circuit 200 configured as described above functions as a negative side bootstrap circuit, and generates the negative voltage VC1 that is always lower than the high-side source voltage Vs_high by a voltage across terminals of the capacitor 204 (VC1=-V2+Vf202+Von_high, where Vf202 is a forward voltage drop of the diode 202, and Von_high is a drain-source voltage drop of the NMOSFET 11 during its ON period), and the negative voltage VC2 that is always lower than the low-side source voltage Vs_low by a voltage across terminals of the capacitor 205 (VC2=VC1+Vf203+Von_low, where Vf203 is a forward voltage drop of the diode 203, and Von_low is a drain-source voltage drop of the NMOSFET 12 during its ON period).

In this way, the negative voltage generation circuit 200 configured as described above can supply the negative voltages VC1 and VC2 to the high-side driver 20 and the low-side driver 30, respectively, using the single DC voltage source 201.

Figure 2:
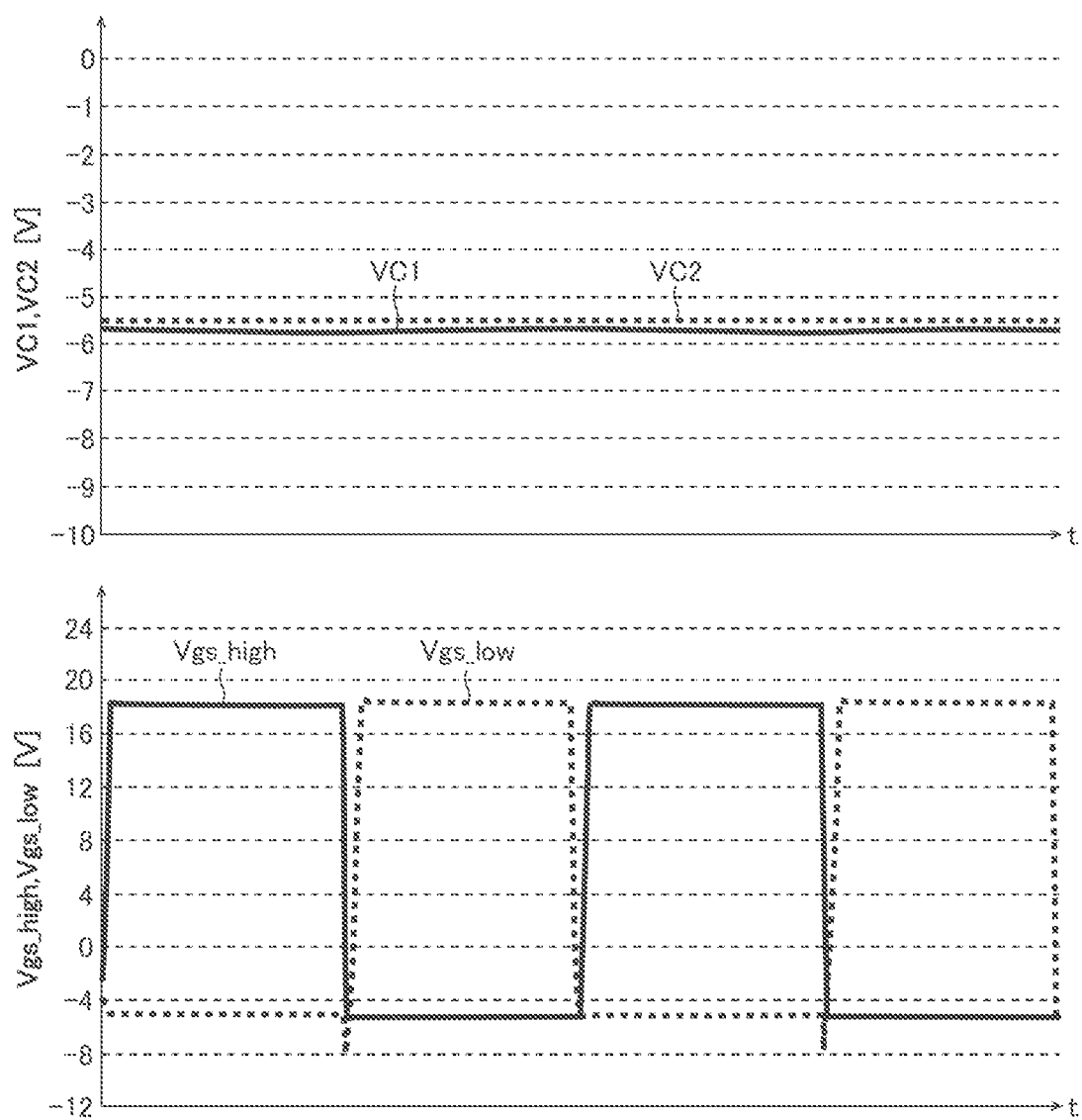
FIG. 2 is a diagram illustrating behaviors of a charging voltage and a gate-source voltage in the first embodiment.

FIG. 2 is a diagram illustrating behaviors of the charging voltages VC1 and VC2 and gate-source voltages Vgs_high and Vgs_low in the first embodiment (a result of simulation when V1=18.6V, V2=6.5V, and Iout=1 A hold).

It can be confirmed from this diagram that the negative voltages VC1 and VC2 are correctly supplied to the high-side driver 20 and the low-side driver 30, respectively, and that the gate-source voltages Vgs_high and Vgs_low of the NMOSFETs 11 and 12 are dropped to the negative voltages VC1 and VC2 during OFF periods of the NMOSFETs 11 and 12, respectively.

Second Embodiment

Figure 3:
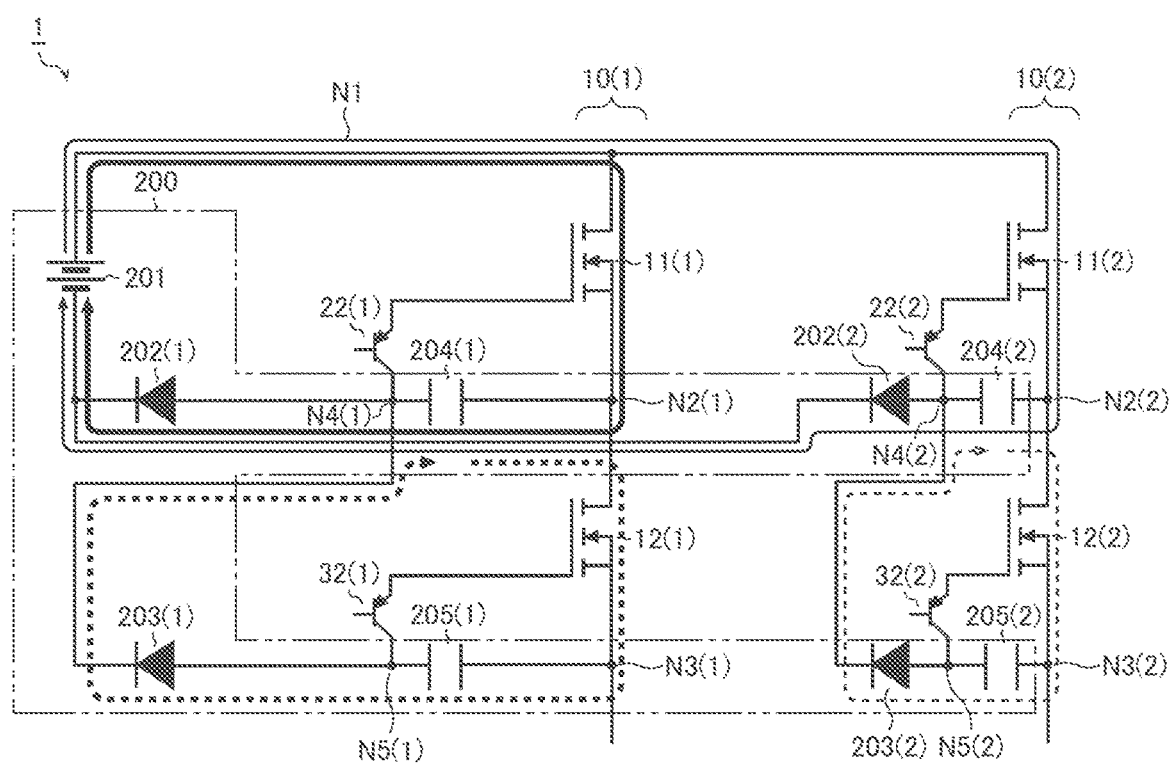
FIG. 3 is a diagram illustrating a second embodiment of the switching power supply device.

FIG. 3 is a diagram illustrating a second embodiment of the switching power supply device. The switching power supply device 1 of this embodiment is based on the first embodiment (FIG. 1), and the switch output stage 10 has multiple phases (two phases in this diagram), as an example. Note that in this diagram, for simple description, only the negative voltage generation circuit 200 and circuit components connected thereto are illustrated, and others such as the positive voltage generation circuit 100 are not illustrated.

As illustrated in this diagram, as the switch output stage 10 has multiple phases, the diodes 202 and 203, and the capacitors 204 and 205 of the negative voltage generation circuit 200 are disposed for each of the multiple phases. In contrast, the single DC voltage source 201 is disposed commonly to the multiple phases.

A connection relationship of the components is specifically described. Note that in the following description, components denoted by numerals with a suffix (1) belong to a first phase, and components denoted by numerals with a suffix (2) belong to a second phase.

Drains of NMOSFETs 11(1) and 11(2) are connected to the node N1. A source and a backgate of the NMOSFET 11(1) and a drain of an NMOSFET 12(1) are connected to a node N2(1). A source and a backgate of the NMOSFET 11(2) and a drain of an NMOSFET 12(2) are connected to a node N2(2). A source and a backgate of the NMOSFET 12(1) are connected to a node N3(1). A source and a backgate of the NMOSFET 12(2) are connected to a node N3(2). A gate of the NMOSFET 11(1) is connected to an emitter of a transistor 22(1). A gate of the NMOSFET 12(1) is connected to an emitter of a transistor 32(1). A gate of the NMOSFET 11(2) is connected to an emitter of a transistor 22(2). A gate of the NMOSFET 12(2) is connected to an emitter of a transistor 32(2).

The positive terminal of the DC voltage source 201 is connected to the node N1. A negative terminal of the DC voltage source 201 is connected to cathodes of diodes 202(1) and 202(2). An anode of the diode 202(1) and a first terminal of a capacitor 204(1) are each connected to a collector of the transistor 22(1) (i.e. a node N4(1)). A second terminal of the capacitor 204(1) is connected to the node N2(1). In contrast, an anode of the diode 202(2) and a first terminal of a capacitor 204(2) are connected to a collector of the transistor 22(2) (i.e. a node N4(2)). A second terminal of the capacitor 204(2) is connected to the node N2(2).

Further, a cathode of a diode 203(1) is connected to the node N4(1). An anode of the diode 203(1) and a first terminal of a capacitor 205(1) are connected to a collector of the transistor 32(1) (i.e. a node N5(1)). A second terminal of the capacitor 205(1) is connected to the node N3(1). In contrast, a cathode of a diode 203(2) is connected to the node N4(2). An anode of the diode 203(2) and a first terminal of a capacitor 205(2) are connected to a collector of the transistor 32(2) (i.e. a node N5(2)). A second terminal of the capacitor 205(2) is connected to the node N3(2).

Note that a thick solid line arrow in this diagram indicates a current path during an ON period of the NMOSFET 11(1). In this way, during the ON period of the NMOSFET 11(1), current flows in a closed circuit including the DC voltage source 201, the NMOSFET 11(1), the capacitor 204(1), and the diode 202(1).

In contrast, a thin solid line arrow in this diagram indicates a current path during an ON period of the NMOSFET 11(2). In this way, during the ON period of the NMOSFET 11(2), current flows in a closed circuit including the DC voltage source 201, the NMOSFET 11(2), the capacitor 204(2), and the diode 202(2).

Further, a thick broken line arrow in this diagram indicates a current path during an ON period of the NMOSFET 12(1). In this way, during the ON period of the NMOSFET 12(1), the capacitor 204(1) becomes a DC voltage source, and current flows in a closed circuit including the capacitor 204(1), the NMOSFET 12(1), the capacitor 205(1), and the diode 203(1).

In contrast, a thin broken line arrow in this diagram indicates a current path during an ON period of the NMOSFET 12(2). In this way, during the ON period of the NMOSFET 12(2), the capacitor 204(2) becomes a DC voltage source, and current flows in a closed circuit including the capacitor 204(2), the NMOSFET 12(2), the capacitor 205(2), and the diode 203(2).

In the negative voltage generation circuit 200 configured as described above, even if the number of phases of the switch output stage 10 is increased, only one power supply (i.e. only the DC voltage source 201) is sufficient for generating negative voltages, and hence an increase in a circuit scale can be avoided.

<Problem When Output Current Increases>

Figure 4:
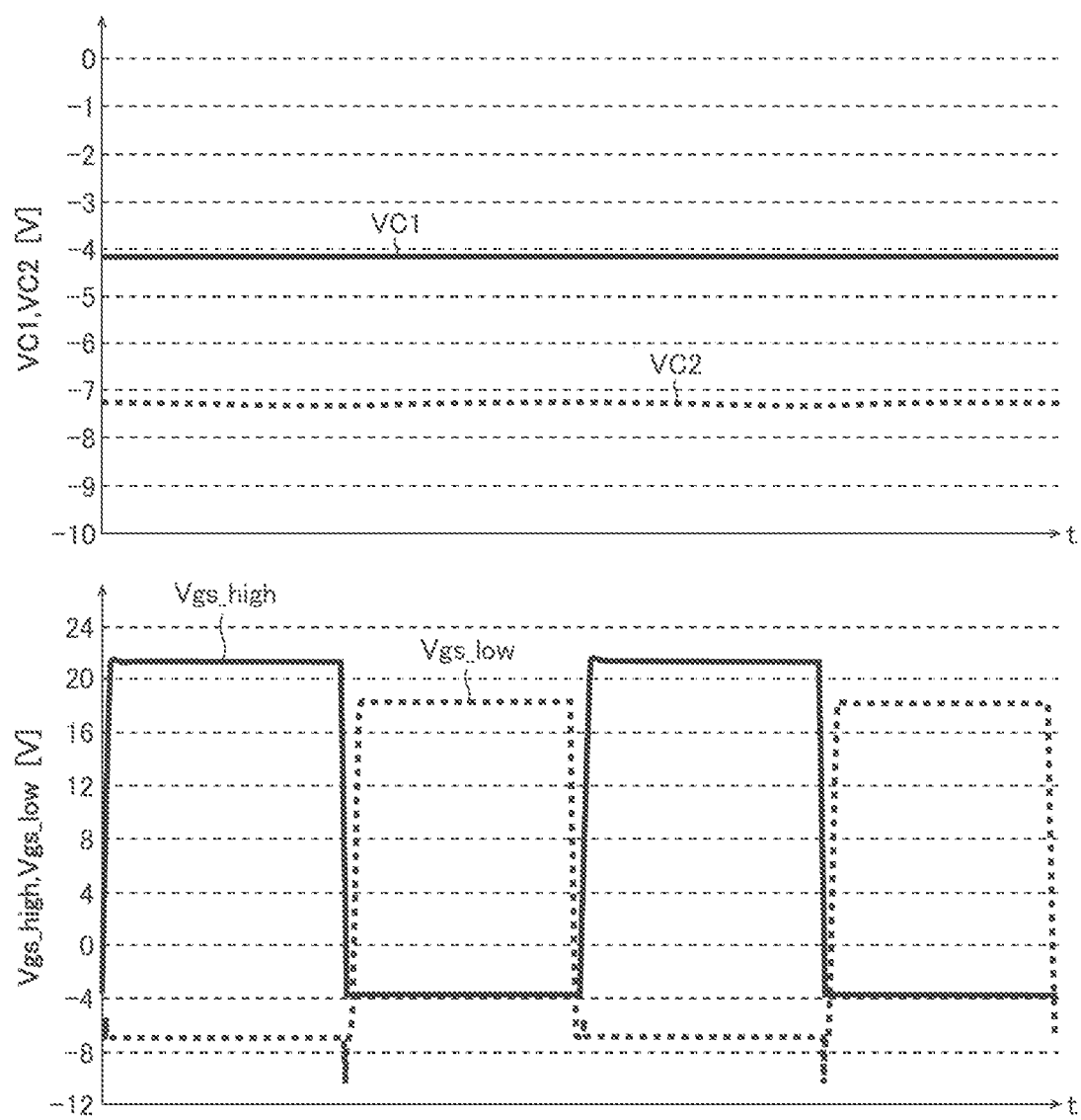
FIG. 4 is a diagram illustrating behaviors of the charging voltage and the gate-source voltage when an output current is increased.

FIG. 4 is a diagram illustrating behaviors of the charging voltages VC1 and VC2 and the gate-source voltages Vgs_high and Vgs_low when the output current Iout increases (a result of simulation when V1=18.6V, V2=6.5V, and Iout=20 A hold).

When the output current Iout increases, drain-source voltage drops Von_high and Von_low of the NMOSFETs 11 and 12 during ON period are increased. As a result, it is clear from comparison between this diagram and FIG. 2 that the negative voltages VC1 and VC2 are shifted from original voltage values, and hence there are variations in high level and low level of each of the gate-source voltages Vgs_high and Vgs_low. A solution of this problem is proposed below.

Third Embodiment

Figure 5:
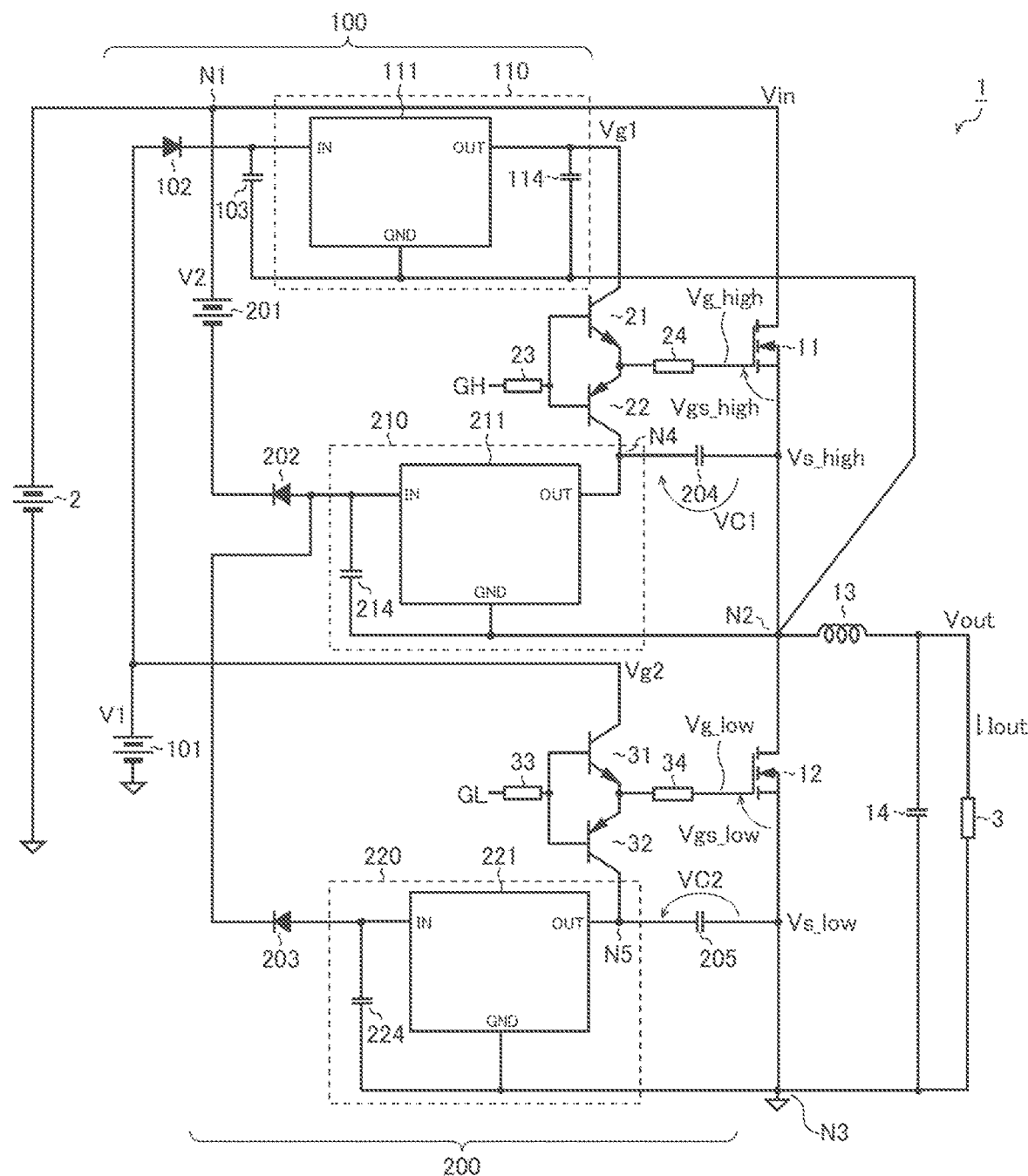
FIG. 5 is a diagram illustrating a third embodiment of the switching power supply device.

FIG. 5 is a diagram illustrating a third embodiment of the switching power supply device. The switching power supply device 1 of this embodiment is based on the first embodiment (FIG. 1), and a regulator 110 is added to the positive voltage generation circuit 100, while regulators 210 and 220 are added to the negative voltage generation circuit 200. Accordingly, the same component as in the first embodiment is denoted by the same numeral or symbol as in FIG. 1 so that overlapping description is omitted, and characteristic parts of this embodiment are mainly described below.

The regulator 110 includes a controller IC 111 and a capacitor 114. An IN pin of the controller IC 111 is connected to a first terminal of the capacitor 103. A GND pin of the controller IC 111 is connected to the node N2. An OUT pin of the controller IC 111 is connected to an output terminal of the positive voltage Vg1. The capacitor 114 is connected between the OUT pin and the GND pin.

The regulator 110 configured as described above stabilizes the positive voltage Vg1.

The regulator 210 includes a controller IC 211 and a capacitor 214. An IN pin of the controller IC 211 is connected to the anode of the diode 202. A GND pin of the controller IC 211 is connected to the node N2. An OUT pin of the controller IC 211 is connected to an output terminal of the negative voltage VC1 (i.e. the node N4). The capacitor 214 is connected between the IN pin and the GND pin.

The regulator 210 configured as described above stabilizes the negative voltage VC1.

The regulator 220 includes a controller IC 221 and a capacitor 224. An IN pin of the controller IC 221 is connected to the anode of the diode 203. A GND pin of the controller IC 221 is connected to the node N3. An OUT pin of the controller IC 221 is connected to the output terminal of the negative voltage VC2 (i.e. the node N5). The capacitor 224 is connected between the IN pin and the GND pin.

The regulator 220 configured as described above stabilizes the negative voltage VC2.

Figure 6:
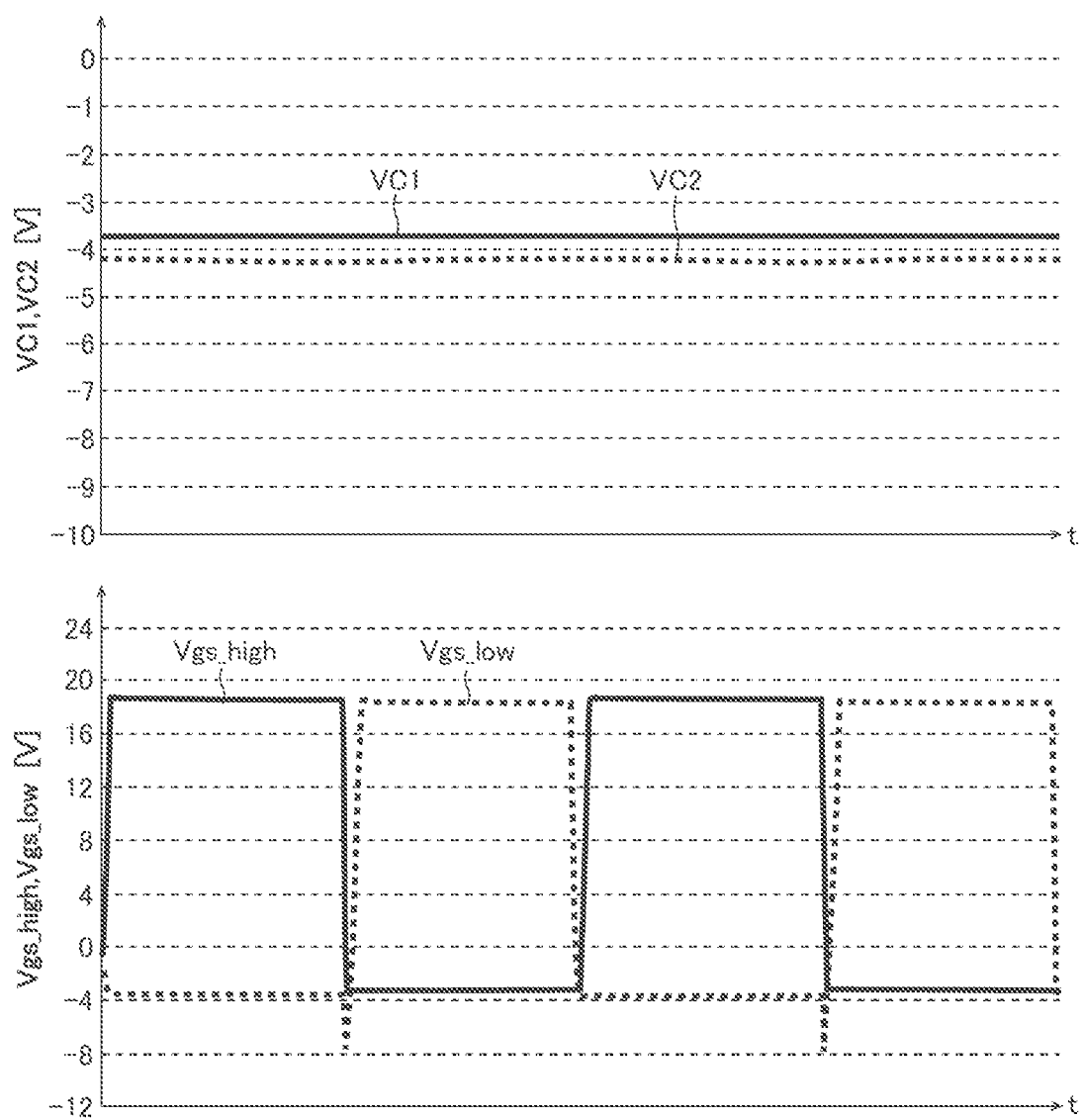
FIG. 6 is a diagram illustrating behaviors of the charging voltage and the gate-source voltage in the third embodiment.

FIG. 6 is a diagram illustrating behaviors of the charging voltages VC1 and VC2 and the gate-source voltages Vgs_high and Vgs_low in the third embodiment (a result of simulation when V1=18.6V, V2=6.5V, and Iout=20 A hold).

It can be confirmed from this diagram that even when the output current Iout increases, voltage fluctuations in the negative voltages VC1 and VC2 (and variations in the gate-source voltages Vgs_high and Vgs_low) can be suppressed thanks to the regulators 210 and 220.

Fourth Embodiment

Figure 7:
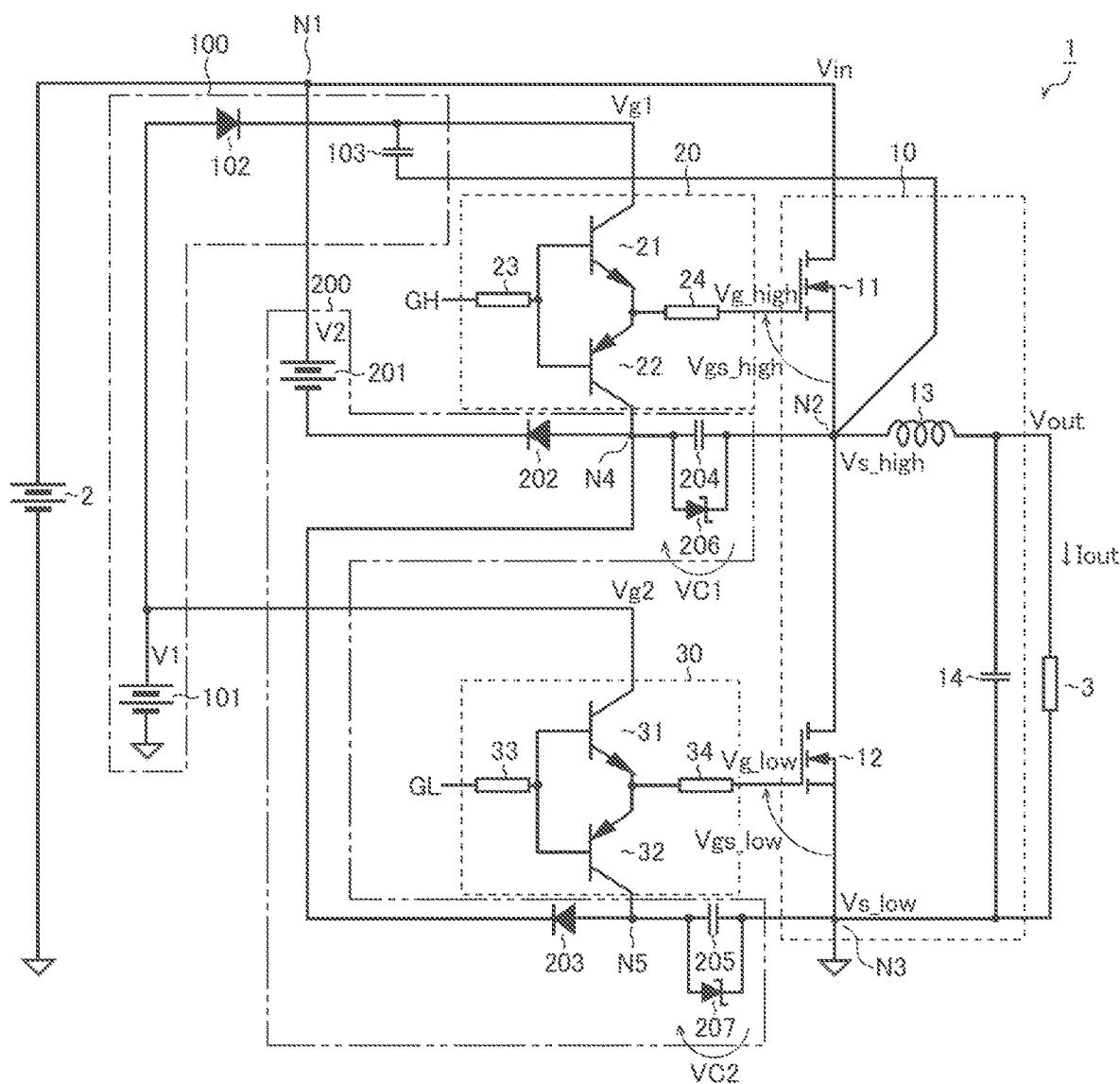
FIG. 7 is a diagram illustrating a fourth embodiment of the switching power supply device.

FIG. 7 is a diagram illustrating a fourth embodiment of the switching power supply device. The switching power supply device 1 of this embodiment is based on the first embodiment (FIG. 1), and zener diodes 206 and 207 are added as components of the negative voltage generation circuit 200. Accordingly, the same component as in the first embodiment is denoted by the same numeral or symbol as in FIG. 1 so that overlapping description is omitted, and characteristic parts of this embodiment are mainly described below.

An anode of the zener diode 206 is connected to the first terminal of the capacitor 204 (i.e. the node N4 as the output terminal of the negative voltage VC1). A cathode of the zener diode 206 is connected to the second terminal of the capacitor 204 (i.e. the node N2).

An anode of the zener diode 207 is connected to the first terminal of the capacitor 205 (i.e. the node N5 as the output terminal of the negative voltage VC2). A cathode of the zener diode 207 is connected to the second terminal of the capacitor 205 (i.e. the node N3).

Note that the zener diodes 206 and 207 function as clampers that respectively limit voltages across terminals of the capacitors 204 and 205 to a predetermined upper limit value or lower. However, the clampers are not limited to the zener diodes 206 and 207, and other elements or circuits having the same action and effect as the zener diodes 206 and 207 may be used.

The switching power supply device 1 of this embodiment can suppress variations in the gate-source voltages Vgs_high and Vgs_low thanks to the zener diodes 206 and 207 even when the output current Iout increases, by a smaller number of elements than the third embodiment (FIG. 5). However, it must be noted that some voltage fluctuation occurs in the negative voltages VC1 and VC2 due to current-voltage characteristics of the zener diodes 206 and 207.

Fifth Embodiment

Figure 8:
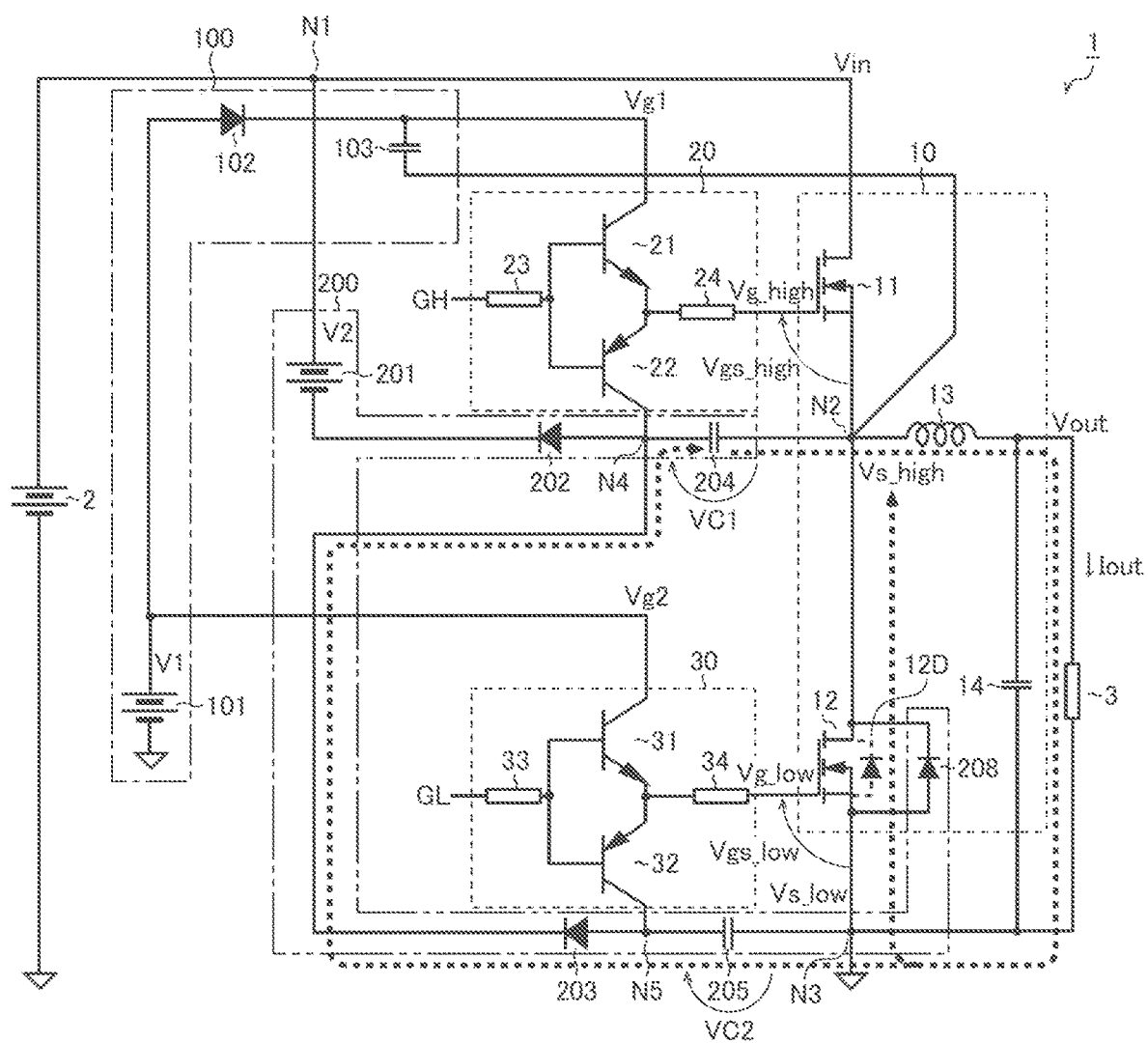
FIG. 8 is a diagram illustrating a fifth embodiment of the switching power supply device.

FIG. 8 is a diagram illustrating a fifth embodiment of the switching power supply device. The switching power supply device 1 of this embodiment is based on the first embodiment (FIG. 1), and a diode 208 is added as a component of the negative voltage generation circuit 200. Accordingly, the same component as in the first embodiment is denoted by the same numeral or symbol as in FIG. 1 so that overlapping description is omitted, and characteristic parts of this embodiment are mainly described below.

A cathode of the diode 208 is connected to the node N2. An anode of the diode 208 is connected to the node N3. In other words, the diode 208 is connected in parallel to a body diode 12D of the NMOSFET 12 in the same direction.

Note that as the diode 208, it is preferred to use an element having a lower forward voltage drop than the body diode of the NMOSFET 12. A technical meaning of using the diode 208 is described below.

Note that a thick broken line arrow in this diagram indicates a current path during the OFF period of the NMOSFET 12. In this way, during the OFF period of the NMOSFET 12, current flows in a closed circuit including the capacitor 204, the inductor 13, the load 3, the capacitor 205, and the diode 203, and reflux current flows in a path including the body diode 12D of the NMOSFET 12 and the additional diode 208.

If the diode 208 is not added, the high-side source voltage Vs_high at the node N2 is defined by a voltage drop generated by the body diode 12D. The voltage drop described above is larger as the reflux current flowing in the body diode 12D is larger, which causes variations in the negative voltages VC1 and VC2 (and variations in the gate-source voltages Vgs_high and Vgs_low).

Accordingly, the diode 208 having a lower forward voltage drop than the body diode 12D is connected in parallel to the same, and hence the voltage drop described above can be suppressed.

Figure 9:
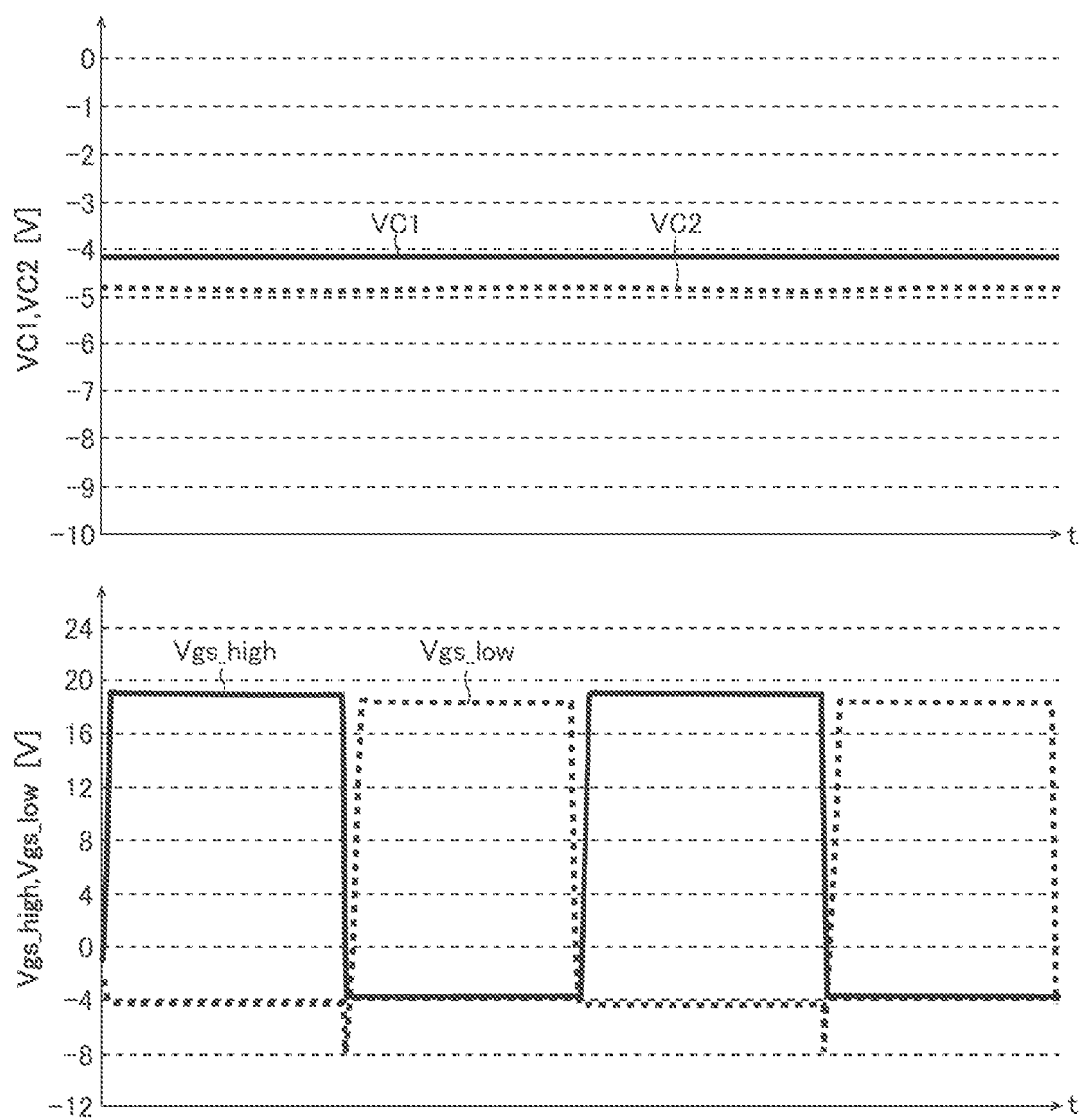
FIG. 9 is a diagram illustrating behaviors of the charging voltage and the gate-source voltage in the fifth embodiment.

FIG. 9 is a diagram illustrating behaviors of the charging voltages VC1 and VC2 and the gate-source voltages Vgs_high and Vgs_low in the fifth embodiment (a result of simulation when V1=18.6V, V2=6.5V, and Iout=20 A hold).

From this diagram, it is confirmed that even when the output current Iout increases, variations of the gate-source voltages Vgs_high and Vgs_low can be suppressed thanks to the diode 208, by a smaller number of elements than the third embodiment (FIG. 5). Further, compared with the fourth embodiment (FIG. 7), voltage fluctuations hardly occur in the negative voltages VC1 and VC2.

Sixth Embodiment

Figure 10:
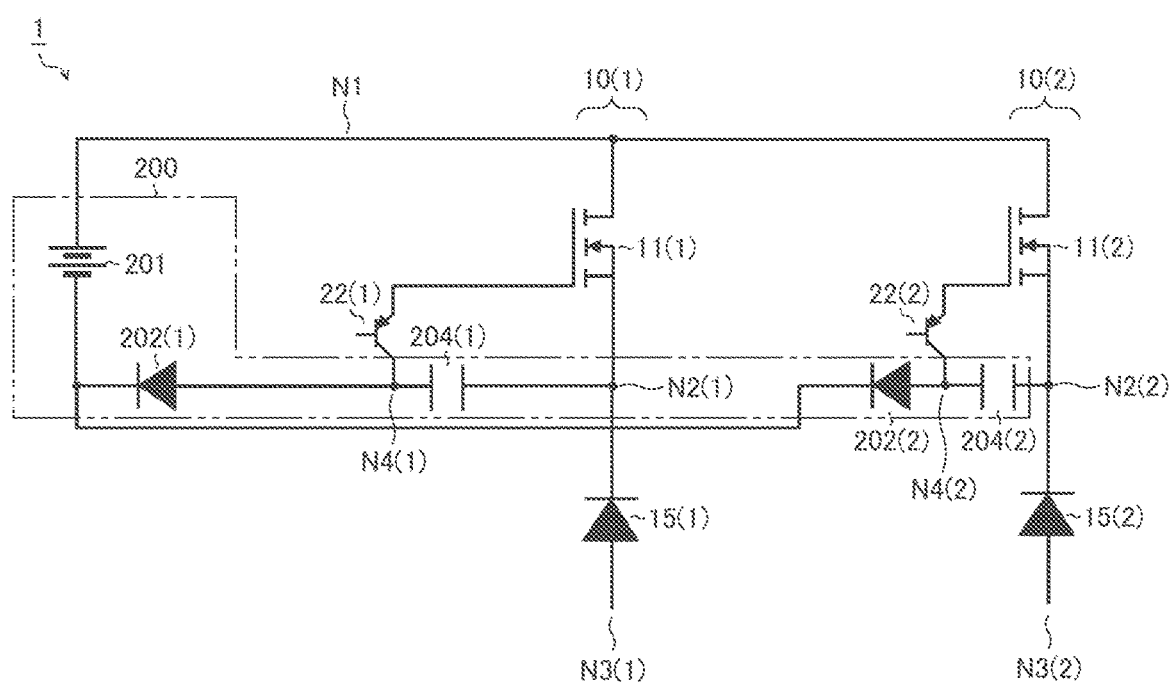
FIG. 10 is a diagram illustrating a sixth embodiment of the switching power supply device.

FIG. 10 is a diagram illustrating a sixth embodiment of the switching power supply device. The switching power supply device 1 of this embodiment is based on the second embodiment (FIG. 3), and diodes 15(1) and 15(2) are used as low-side switches of switch output stages 10(1) and 10(2), respectively. In other words, the switch output stages 10(1) and 10(2) are changed from a synchronous rectification method to a diode rectification method (i.e. an asynchronous rectification method). Further, along with this method change, the diodes 203(1) and 203(2), and the capacitors 205(1) and 205(2) are removed from components of the negative voltage generation circuit 200.

In this way, the negative voltage generation circuit 200 can be used as means for supplying negative voltages to high-side drivers 20(1) and 20(2) also in a case where the switch output stages 10(1) and 10(2) adopt the diode rectification method.

Further, in this diagram, the description is based on the second embodiment (FIG. 3) in which the switch output stage 10 has multiple phases, but it is needless to say that the negative voltage generation circuit 200 can be used as means for supplying the negative voltage to the high-side driver 20 also in a case where the first embodiment (FIG. 1), the third embodiment (FIG. 5), or the fourth embodiment (FIG. 7) is used as a base, and the single-phase switch output stage 10 is changed to the diode rectification method.

<Application to Three-Phase Inverter>

Figure 11:
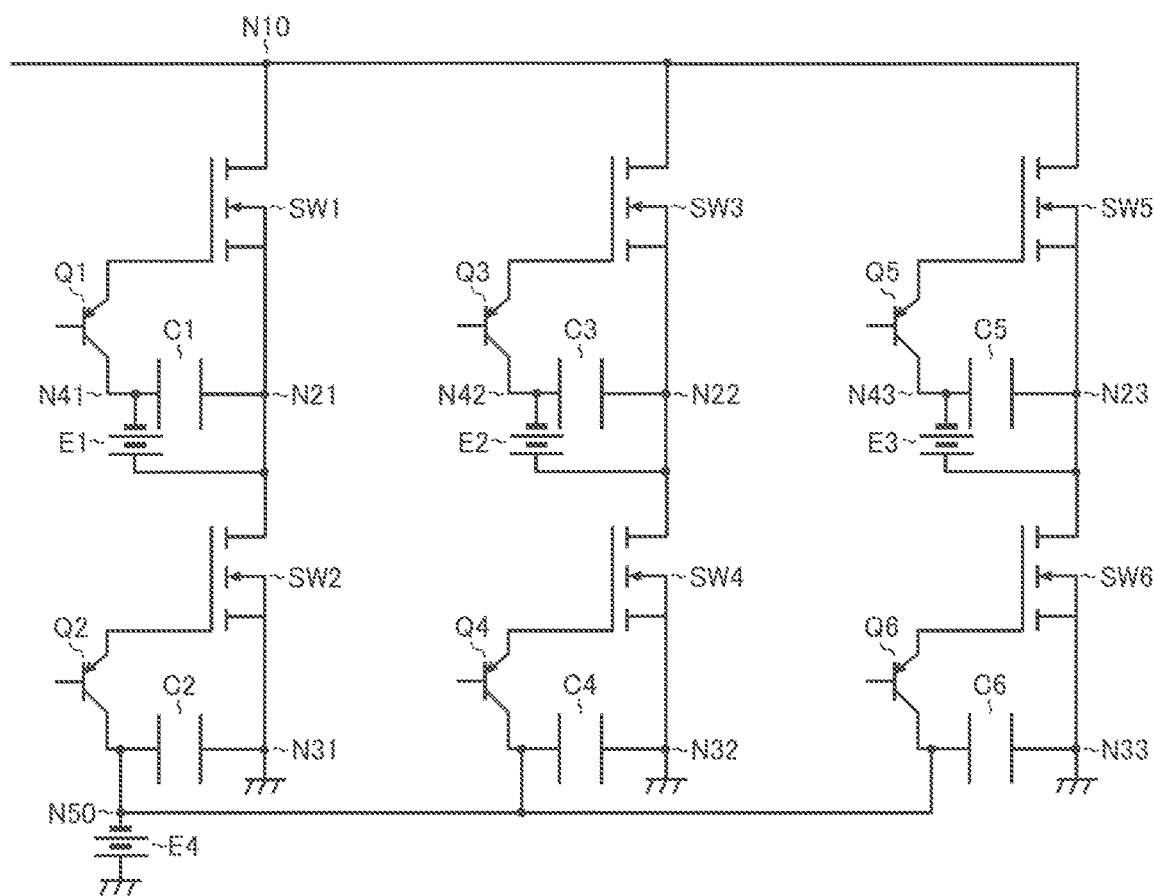
FIG. 11 is a diagram illustrating a first structural example of a three-phase inverter.

FIG. 11 is a diagram illustrating a first structural example of a three-phase inverter (in which the negative voltage generation circuit 200 is not used). The three-phase inverter of this structural example is one type of a power conversion device that converts a DC power into an AC power, and includes switches SW1 to SW6 (e.g. NMOSFETs), capacitors C1 to C6, pnp type bipolar transistors Q1 to Q6, and DC voltage sources E1 to E4. Note that in this diagram, for simple description, only the negative side circuit components are illustrated, and the positive side circuit components are not illustrated.

Drains of the switches SW1, SW3, and SW5 are connected to a node N10. A source and a backgate of the switch SW1, a drain of the switch SW2, a first terminal of the capacitor C1, and a positive terminal of the DC voltage source E1 are connected to a node N21. A source and a backgate of the switch SW3, a drain of the switch SW4, a first terminal of the capacitor C3, and a positive terminal of the DC voltage source E2 are connected to a node N22. A source and a backgate of the switch SW5, a drain of the switch SW6, a first terminal of the capacitor C5, and a positive terminal of the DC voltage source E3 is connected to a node N23. Gates of the switches SW1, SW3, and SW5 are connected to emitters of the transistors Q1, Q3, and Q5, respectively. A collector of the transistor Q1, a second terminal of the capacitor C1, and a negative terminal of the DC voltage source E1 are connected to a node N41. A collector of the transistor Q3, a second terminal of the capacitor C3, and a negative terminal of the DC voltage source E2 are connected to a node N42. A collector of the transistor Q5, a second terminal of the capacitor C5, and a negative terminal of the DC voltage source E3 are connected to a node N43.

A source and a backgate of the switch SW2, and a first terminal of the capacitor C2 are connected to a node N31 (ground terminal). A source and a backgate of the switch SW4, and a first terminal of the capacitor C4 are connected to a node N32 (ground terminal). A source and a backgate of the switch SW6, and a first terminal of the capacitor C6 are connected to a node N33 (ground terminal). Gates of the switches SW2, SW4, and SW6 are connected to emitters of the transistors Q2, Q4, and Q6, respectively. Collectors of the transistors Q2, Q4, and Q6, second terminals of the capacitors C2, C4, and C6, and a negative terminal of the DC voltage source E4 are connected to a node N50. A positive terminal of the DC voltage source E4 is connected to the ground terminal.

As illustrated in this diagram, in the first structural example in which the negative voltage generation circuit 200 is not used, total four DC voltage sources (the DC voltage sources E1 to E3 for the switches SW1, SW3, and SW5, respectively, and the DC voltage source E4 shared by the switches SW2, SW4, and SW6) are necessary as means for generating negative voltages.

Figure 12:
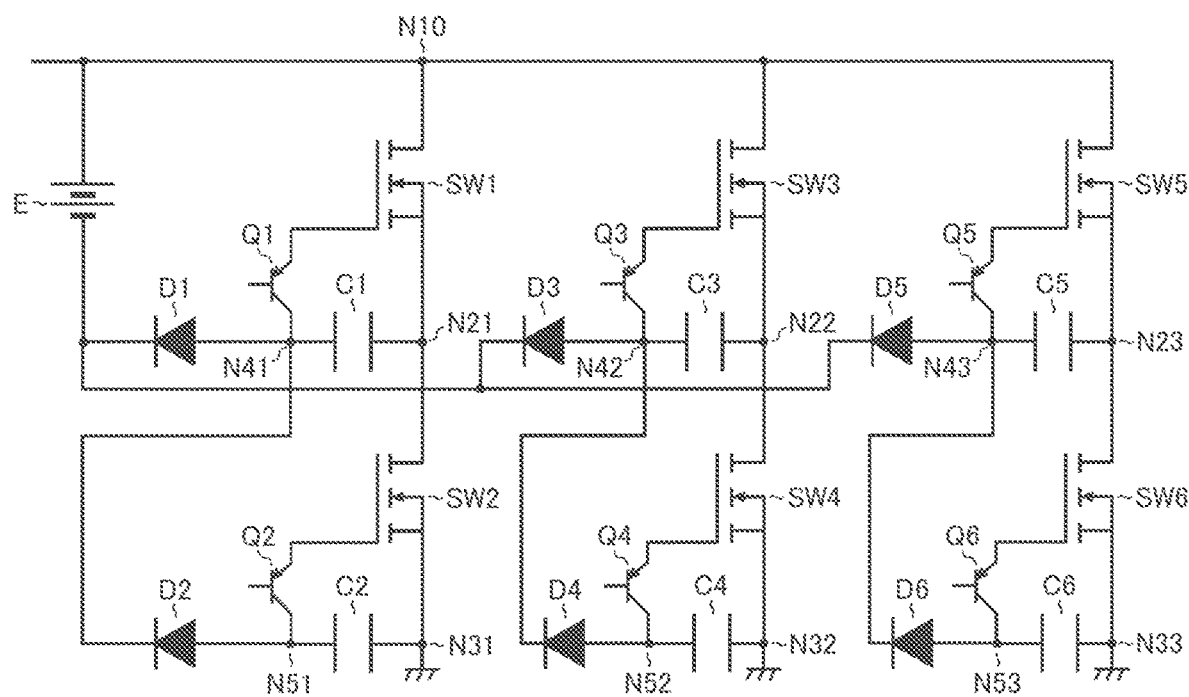
FIG. 12 is a diagram illustrating a second structural example of the three-phase inverter.

FIG. 12 is a diagram illustrating a second structural example of the three-phase inverter (in which the negative voltage generation circuit 200 is used). The three-phase inverter of this structural example includes diodes D1 to D6 and a DC voltage source E instead of the DC voltage sources E1 to E4 described above.

The drains of the switches SW1, SW3, and SW5 and a positive terminal of the DC voltage source E are connected to the node N10. The source and the backgate of the switch SW1, the drain of the switch SW2, and the first terminal of the capacitor C1 are connected to the node N21. The source and the backgate of the switch SW3, the drain of the switch SW4, and the first terminal of the capacitor C3 are connected to the node N22. The source and the backgate of the switch SW5, the drain of the switch SW6, and the first terminal of the capacitor C5 are connected to the node N23. The gates of the switches SW1, SW3, and SW5 are connected to the emitters of the transistors Q1, Q3, and Q5, respectively. The collector of the transistor Q1, the second terminal of the capacitor C1, an anode of the diode D1, and a cathode of the diode D2 are connected to the node N41. The collector of the transistor Q3, the second terminal of the capacitor C3, an anode of the diode D3, and a cathode of the diode D4 are connected to the node N42. The collector of the transistor Q5, the second terminal of the capacitor C5, the anode of the diode D5, and the cathode of the diode D6 are connected to the node N43. Cathodes of the diodes D1, D3 and D5 are connected to the negative terminal of the DC voltage source E1.

The source and the backgate of the switch SW2, and the first terminal of the capacitor C2 are connected to the node N31 (ground terminal). The source and the backgate of the switch SW4, and the first terminal of the capacitor C4 are connected to the node N32 (ground terminal). The source and the backgate of the switch SW6, and the first terminal of the capacitor C6 are connected to the node N33 (ground terminal). The gates of the switches SW2, SW4, and SW6 are connected to the emitters of the transistors Q2, Q4, and Q6, respectively. The collector of the transistor Q2, the second terminal of the capacitor C2, and an anode of the diode D2 are connected to a node N51. The collector of the transistor Q4, the second terminal of the capacitor C4, and the anode of the diode D4 are connected to a node N52. The collector of the transistor Q6, the second terminal of the capacitor C6, and the anode of the diode D6 are connected to a node N53.

Note that the three-phase inverter of this structural example can be understood as an extension of the switching power supply 1 of FIG. 3 to be a three-phase output type. In other words, the switches SW1, SW3, and SW5 correspond to the NMOSFETs 11(1) to 11(3), respectively, and the switches SW2, SW4, and SW6 correspond to the NMOSFETs 12(1) to 12(3), respectively. The transistors Q1, Q3, and Q5 correspond to the transistors 22(1) to 22(3), respectively, and the transistors Q2, Q4, and Q6 correspond to the transistors 32(1) to 32(3), respectively. The capacitors C1, C3, and C5 correspond to the capacitors 204(1) to 204(3), respectively, and the capacitors C2, C4, and C6 correspond to the capacitors 205(1) to 205(3), respectively. The diodes D1, D3, and D5 correspond to the diodes 202(1) to 202(3), and the diodes D2, D4, and D6 correspond to the diodes 203(1) to 203(3), respectively. Further, DC voltage source E corresponds to the DC voltage source 201.

As illustrated in this diagram, the second structural example, in which the negative voltage generation circuit 200 is used, needs only one power supply (i.e. only the DC voltage source E) for generating the negative voltages even if the number of output phases increases, and hence an increase in the circuit scale can be avoided.

Figure 13:
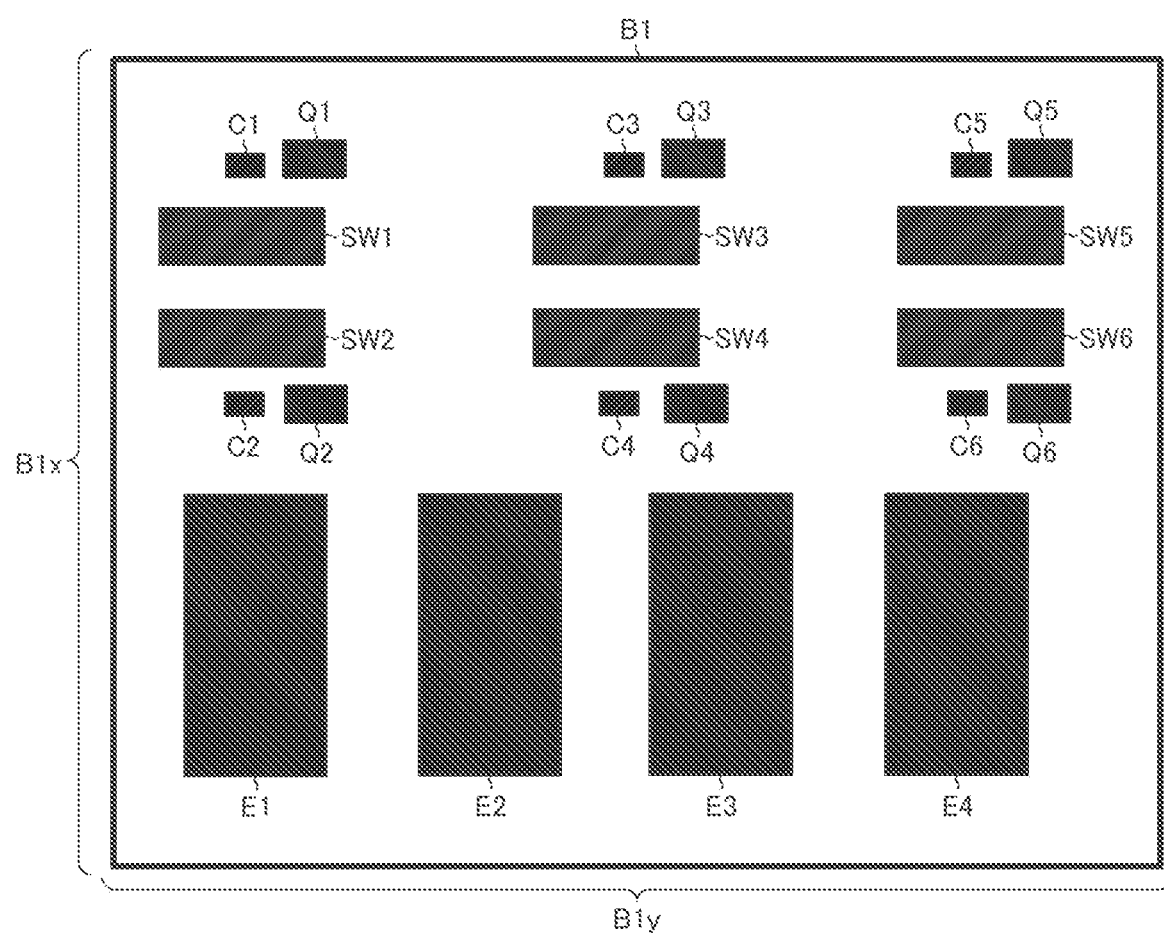
FIG. 13 is a diagram illustrating a parts layout in the first structural example.

FIG. 13 is a diagram illustrating a parts layout example on a substrate B1 on which the three-phase inverter of the first structural example (FIG. 11) is mounted. Note that in the following description, the vertical direction (up and down direction) and the lateral direction (left and right direction) of the paper are defined respectively as the vertical direction (up and down direction) and the lateral direction (left and right direction) of the substrate B1 for specific description. Further, the vertical direction (up and down direction) of the substrate B1 corresponds to an extending direction of a vertical side B1$x$. Further, the lateral direction (left and right direction) of the substrate B1 corresponding to an extending direction of a lateral side B1$y$. Note that the substrate B1 may be understood as a printed wiring board or a module substrate.

Each of the switches SW1 to SW6 is sealed in a rectangular package having a longitudinal direction and a short direction in a plan view. The switches SW1, SW3, and SW5 are arranged in the lateral direction (left and right direction) in the order shown in the diagram, in such a manner that longitudinal directions thereof are parallel to the lateral side B1$y$. Therefore the switches SW1, SW3, and SW5 appear to overlap each other viewed from the longitudinal direction thereof (i.e. viewed from the vertical side B1$x$). Further, the switches SW2, SW4, and SW6 are arranged in the lateral direction (left and right direction) in the order shown in the diagram, in such a manner that longitudinal directions thereof are parallel to the lateral side B1$y$. Therefore the switches SW2, SW4, and SW6 appear to overlap each other viewed from the longitudinal direction thereof (i.e. viewed from the vertical side B1$x$).

The switches SW1 and SW2 are arranged in the vertical direction (up and down direction) in the order shown in the diagram. Therefore the switches SW1 and SW2 appear to overlap each other viewed from the short direction thereof (i.e. viewed from the lateral side B1$y$). In the same manner, the switches SW3 and SW4 are arranged in the vertical direction (up and down direction) in the order shown in the diagram. Therefore the switches SW3 and SW4 appear to overlap each other viewed from the short direction thereof. Further, the switches SW5 and SW6 are arranged in the vertical direction (up and down direction) in the order shown in the diagram. Therefore the switches SW5 and SW6 appear to overlap each other viewed from the short direction thereof.

Each of the capacitors C1 to C6 has a rectangular shape with a longitudinal direction and a short direction in a plan view, and is a discrete component smaller than each of the switches SW1 to SW6. The capacitors C1, C3, and C5 are arranged laterally above the switches SW1, SW3, and SW5, respectively at the middle between the left and right thereof, in such a manner that the longitudinal direction thereof is parallel to the lateral side B1$y$. The capacitors C1, C3, and C5 appear to overlap the switches SW1, SW3, and SW5, respectively, viewed from the short direction thereof (i.e. viewed from the lateral side B1$y$). Further, the capacitors C2, C4, and C6 are arranged laterally below the switches SW2, SW4, and SW6, respectively at the middle between the left and right thereof, in such a manner that the longitudinal direction thereof is parallel to the lateral side B1$y$. Therefore the capacitors C2, C4, and C6 appear to overlap the switches SW2, SW4, and SW6, respectively, viewed from the short direction thereof (i.e. viewed from the lateral side B1$y$).

Each of the transistors Q1 to Q6 has a rectangular shape with a longitudinal direction and a short direction in a plan view, and is a discrete component smaller than each of the switches SW1 to SW6 and larger than each of the capacitors C1 to C6. The transistors Q1, Q3, and Q5 are disposed on the right of the capacitors C1, C3, and C5, respectively, in such a manner that the longitudinal direction thereof is parallel to the lateral side B1$y$. Note that the transistors Q1, Q3, and Q5 appear to overlap the switches SW1, SW3, and SW5, respectively and at least partially, viewed from the short direction thereof (i.e. viewed from the lateral side B1$y$). The transistors Q2, Q4, and Q6 are disposed on the right of the capacitors C2, C4, and C6, respectively, in such a manner that the longitudinal direction thereof is parallel to the lateral side B1$y$. Note that the transistors Q2, Q4, and Q6 appear to overlap the switches SW2, SW4, and SW6, respectively and at least partially, viewed from the short direction thereof (i.e. viewed from the lateral side B1$y$).

In this way, the switch output stage of the first phase (SW1, SW2, Q1, Q2, C1, and C2), the switch output stage of the second phase (SW3, SW4, Q3, Q4, C3, and C4), and the switch output stage of the third phase (SW5, SW6, Q5, Q6, C5, and C6) are arranged in the lateral direction (left and right direction) in the order shown in the diagram.

Note that it is preferred to dispose the capacitors C1 to C6 and the transistors Q1 to Q6 close to the switches SW1 to SW6 as much as possible, in order to form a small closed loop between gate and source of each of the switches SW1 to SW6. For instance, it is sufficient to dispose the capacitors C1 to C6 in such a manner that a distance between the capacitor C1 to C6 and the switch SW1 to SW6 is shorter than the long side of the switch SW1 to SW6. The same is true for the transistors Q1 to Q6.

The DC voltage sources E1 to E4 are circuit blocks formed in areas below the capacitors C2, C4, and C6, and the transistors Q2, Q4, and Q6, respectively, and are arranged in the lateral direction (left and right direction) in the order shown in the diagram. Therefore the DC voltage sources E1 to E4 appear to overlap each other viewed from the vertical side B1$x$. Further, the DC voltage source E1 appears to overlap the switches SW1 and SW2 viewed from the lateral side B1$y$. The DC voltage sources E2 and E3 appear to overlap the switches SW3 and SW4 partially, viewed from the lateral side B1$y$. The DC voltage source E4 appears to overlap the switches SW5 and SW6 mostly viewed from the lateral side B1$y$.

Figure 14:
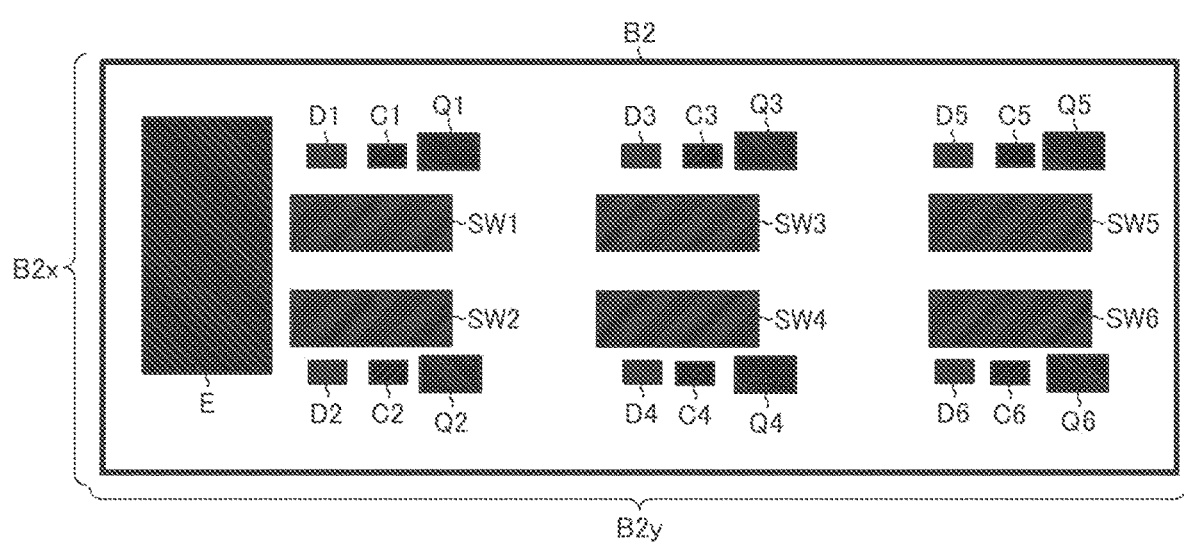
FIG. 14 is a diagram illustrating a parts layout in the second structural example.

FIG. 14 is a diagram illustrating a layout example on a substrate B2 on which the three-phase inverter of the second structural example (FIG. 12) is mounted. Note that in the same manner as above description, in the following description, the vertical direction (up and down direction) and the lateral direction (left and right direction) of the paper are defined respectively as the vertical direction (up and down direction) and the lateral direction (left and right direction) of the substrate B2 for specific description. Here, the layout of the switches SW1 to SW6 and the capacitors C1 to C6 is the same as that of FIG. 13 described above, and overlapping description is omitted.

Each of the diodes D1 to D6 has a rectangular shape with a longitudinal direction and a short direction in a plan view, and is a discrete component that is smaller than each of the switches SW1 to SW6 and has substantially the same size as each of the capacitors C1 to C6. The diodes D1 to D6 are disposed at the left of the capacitors C1 to C6, respectively, in such a manner that the longitudinal direction thereof is parallel to the lateral side B1$y$. In other words, the diodes D1 to D6, the capacitors C1 to C6, and the transistors Q1 to Q6 are respectively aligned in the lateral direction (left and right direction) in the order shown in the diagram. Note that the diodes D1, D3, and D5 appear to overlap the switches SW1, SW3, and SW5, respectively, viewed from the short direction thereof (i.e. viewed from the lateral side B1y). Further, the diodes D2, D4, and D6 appear to overlap the switches SW2, SW4, and SW6, respectively, viewed from the short direction thereof (i.e. viewed from the lateral side B1y).

The DC voltage source E is a circuit block disposed in the left area of the switches SW1 and SW2 so as to be adjacent to both of them. In other words, the DC voltage source E is disposed in the same row as the switch output stages of the individual phases. Further, a first direction (the lateral direction), in which the DC voltage source E and the switch output stages of the individual phases are arranged, is perpendicular to a second direction (vertical direction) in which the switches SW1 and SW2 (or the switches SW3 and SW4, or the switches SW5 and SW6) are arranged. Note that the DC voltage source E appears to overlap the switches SW1 to SW6, the capacitors C1 to C6, the transistors Q1 to Q6, and the diodes D1 to D6 mostly, viewed from the vertical side B1x.

In this way, the three-phase inverter of the second structural example can reduce three large and expensive DC voltage sources only by adding the diodes D1 to D6. Therefore it is clear from comparison between FIG. 13 and FIG. 14 that an area of the substrate B2 can be much smaller than that of the substrate B1.

<Summary>

In the following description, various embodiments disclosed in this specification are summarized.

The negative voltage generation circuit disclosed in this specification includes a first DC voltage source having a positive terminal connected to a first node, a first diode having a cathode connected to a negative terminal of the first DC voltage source and an anode connected to an output terminal of a first negative voltage, and a first capacitor having a first terminal connected to the output terminal of the first negative voltage and a second terminal connected to a second node, in which the first negative voltage is supplied to a first driver arranged to perform switching control of a first switch element connected between the first node and the second node (first structure).

Note that in the negative voltage generation circuit having the first structure described above, it is preferred to adopt a structure in which the first DC voltage source is disposed commonly to a plurality of phases, and the first diode and the first capacitor are disposed separately for each of the plurality of phases (second structure).

Further, in the negative voltage generation circuit having the first or second structure described above, it is preferred to adopt a structure further including a regulator arranged to stabilize the first negative voltage (third structure).

Further, in the negative voltage generation circuit having the first or second structure described above, it is preferred to adopt a structure further including a clamper arranged to limit a voltage across terminals of the first capacitor (fourth structure).

Further, in the negative voltage generation circuit having the fourth structure described above, it is preferred to adopt a structure in which the clamper is a zener diode having an anode connected to the output terminal of the first negative voltage and a cathode connected to the second node (fifth structure).

Further, in the negative voltage generation circuit having any one of the first to fifth structures described above, it is preferred to adopt a structure further comprising a second diode having a cathode connected to the output terminal of the first negative voltage and an anode connected to an output terminal of the second negative voltage, and a second capacitor having a first terminal connected to the output terminal of the second negative voltage and a second terminal connected to a third node, in which the second negative voltage is applied to a second driver arranged to perform switching control of a second switch element connected between the second node and the third node (sixth structure).

Further, in the negative voltage generation circuit having the sixth structure described above, it is preferred to adopt a structure in which each of the first switch element and the second switch element is an NMOSFET, and the negative voltage generation circuit further includes a third diode having a cathode connected to the second node, an anode connected to the third node, and a forward voltage drop lower than that of a body diode of the second switch element (seventh structure).

Further, the power conversion device disclosed in this specification includes a switch output stage including a first switch element, a first driver, a positive voltage generation circuit arranged to supply a first positive voltage to the first driver, and the negative voltage generation circuit having any one of the first to fifth structures described above, arranged to supply the first negative voltage to the first driver (eighth structure).

Further, the power conversion device disclosed in this specification includes a switch output stage including the first switch element and the second switch element, the first driver, the second driver, a positive voltage generation circuit arranged to supply a first positive voltage and a second positive voltage to the first driver and the second driver, respectively, and the negative voltage generation circuit having the sixth or seventh structure, arranged to supply the first negative voltage and the second negative voltage to the first driver and the second driver, respectively (ninth structure).

Note that in the power conversion device having the eighth or ninth structure described above, it is preferred to adopt a structure in which the positive voltage generation circuit includes a second DC voltage source, a fourth diode having an anode connected to an positive terminal of the second DC voltage source and a cathode connected to an output terminal of the first positive voltage, and a third capacitor having a first terminal connected to the output terminal of the first positive voltage and a second terminal connected to the second node (tenth structure).

Further, in the power conversion device having any one of the eighth to tenth structures described above, it is preferred to adopt a structure in which a plurality of the switch output stages are used for converting a DC power into an AC power (eleventh structure).

Further, in the power conversion device having the eleventh structure described above, it is preferred to adopt a structure in which the plurality of switch output stages are aligned in a row (twelfth structure).

Further, in the power conversion device having the twelfth structure described above, it is preferred to adopt a structure in which the first DC voltage source is disposed in the same row as the plurality of switch output stages (thirteenth structure).

Further, in the power conversion device having the ninth structure described above, it is preferred to adopt a structure in which a first direction in which the first DC voltage source and the switch output stage are arranged is perpendicular to a second direction in which the first switch element and the second switch element are arranged (fourteenth structure).

Further, in the power conversion device having any one of the eleventh to fourteenth structures described above, it is preferred to adopt a structure in which a distance between the first capacitor and the first switch element is shorter than a long side of the first switch element (fifteenth structure).

Further, in the power conversion device having any one of the eleventh to fifteenth structures described above, it is preferred to adopt a structure in which the first diode, the first capacitor, and a transistor of the first driver connected thereto are aligned in a row (sixteenth structure).

<Other Variations>

Note that other than the embodiments described above, various technical features disclosed in this specification can be variously modified within the scope of the technical invention without deviating from the spirit thereof. For instance, the negative voltage generation circuit described above can be applied to various power conversion devices without limiting to the three-phase inverter, and further can be applied to devices other than the power conversion device.

Further, although the embodiment described above exemplifies a case where the switch output stage has a two-stage structure (i.e. the structure in which two NMOSFETs are connected in series), it is needless to say that the negative voltage generation circuit described above can be applied also to a case where the switch output stage has a multiple (three or more) stages.

In other words, the embodiment described above is merely an example in every aspect and should not be interpreted as a limitation. The technical scope of the present invention is not limited to the embodiment described above but should be understood to include all modifications within the meaning and scope equivalent to the claims.

Further, although the above embodiment describes only the case where the NMOSFET is used as the switch element, it is possible to use not only a junction field effect transistor (JFET) or an insulated gate bipolar transistor (IGBT), which are made of Si, but also a semiconductor switch made of SiC or GaN, as the switch element.

Further, the embodiment described above not only can increase a turn-off speed of the switch element but also can prevent a decrease in switching loss or a malfunction called a firing failure, compared with the conventional structure.

INDUSTRIAL APPLICABILITY

The negative voltage generation circuit disclosed in this specification can be used for power conversion devices in general, such as switching power supply devices.

LIST OF REFERENCE SIGNS 1 switching power supply device (power conversion device)
2 DC voltage source
3 load
10 switch output stage
11 NMOSFET (high-side switch)
12 NMOSFET (low-side switch)
12D body diode
13 inductor
14 capacitor
15 diode (low-side switch)
20 high-side driver
21 npn type bipolar transistor
22 pnp type bipolar transistor
23, 24 resistor
30 low-side driver
31 npn type bipolar transistor
32 pnp type bipolar transistor
33, 34 resistor
100 positive voltage generation circuit
101 DC voltage source
102 diode
103 capacitor
110 regulator
111 controller IC
114 capacitor
200 negative voltage generation circuit
201 DC voltage source
202, 203 diode
204, 205 capacitor
206, 207 zener diode (clamper)
208 diode
210, 220 regulator
211, 221 controller IC
214, 224 capacitor
B1, B2 substrate
C1 to C6 capacitor
D1 to D6 diode
E1 to E4, E DC voltage source
N1, N10 first node (input node)
N2, N21 to N23 second node (switch node)
N3, N31 to N33 third node (ground node)
N4, N41 to N43 fourth node (first negative output node)
N5, N50, N51 to N53 fifth node (second negative output node)
Q1 to Q6 pnp type bipolar transistor
SW1 to SW6 switch element (NMOSFET)

The invention claimed is:

1. A negative voltage generation circuit comprising:
a first DC voltage source having a positive terminal connected to a first node;
a first diode having a cathode connected to a negative terminal of the first DC voltage source and an anode connected to an output terminal of a first negative voltage; and
a first capacitor having a first terminal connected to the output terminal of the first negative voltage and a second terminal connected to a second node, wherein
the first negative voltage is supplied to a first driver arranged to perform switching control of a first switch element connected between the first node and the second node, and
the negative voltage generation circuit further comprises:
a second diode having a cathode connected to the output terminal of the first negative voltage and an anode connected to an output terminal of a second negative voltage; and
a second capacitor having a first terminal connected to the output terminal of the second negative voltage and a second terminal connected to a third node,
an inductor and a further capacitor connected between the second node and the third node, wherein
the second negative voltage is applied to a second driver arranged to perform switching control of a second switch element connected between the second node and the third node.

2. The negative voltage generation circuit according to claim 1, wherein each of the first switch element and the second switch element is an NMOSFET, and
the negative voltage generation circuit further comprises a third diode having a cathode connected to the second node, an anode connected to the third node, and a forward voltage drop lower than that of a body diode of the second switch element.

3. A power conversion device comprising:
a negative voltage generation circuit according to claim 1;
a switch output stage including the first switch element and the second switch element;
the first driver;
the second driver; and
a positive voltage generation circuit arranged to supply a first positive voltage and a second positive voltage to the first driver and the second driver, respectively,
wherein the negative voltage generation circuit is arranged to supply the first negative voltage and the second negative voltage to the first driver and the second driver, respectively.

4. The power conversion device according to claim 3, wherein the positive voltage generation circuit includes:
a second DC voltage source;
a third diode having an anode connected to a positive terminal of the second DC voltage source and a cathode connected to an output terminal of the first positive voltage; and
a third capacitor having a first terminal connected to the output terminal of the first positive voltage and a second terminal connected to the second node.

5. The power conversion device according to claim 3, wherein a first direction in which the first DC voltage source and the switch output stage are arranged is perpendicular to a second direction in which the first switch element and the second switch element are arranged.

* * * * *